United States Patent
Kong et al.

(10) Patent No.: US 10,291,243 B2
(45) Date of Patent: May 14, 2019

(54) DIGITAL LINEARIZATION TECHNIQUE FOR CHARGE PUMP BASED FRACTIONAL PHASED-LOCKED LOOP

(71) Applicant: Apple Inc., Cupertino, CA (US)

(72) Inventors: Robert K. Kong, San Francisco, CA (US); Feng Zhao, San Jose, CA (US); Wei Deng, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/960,523

(22) Filed: Apr. 23, 2018

(65) Prior Publication Data

US 2018/0241405 A1     Aug. 23, 2018

Related U.S. Application Data

(63) Continuation of application No. 15/421,884, filed on Feb. 1, 2017, now Pat. No. 9,954,542.

(51) Int. Cl.
*H03L 7/197*       (2006.01)
*H03L 7/089*       (2006.01)
(Continued)

(52) U.S. Cl.
CPC ............ *H03L 7/1974* (2013.01); *H03L 7/089* (2013.01); *H03L 7/0891* (2013.01); *H03L 7/099* (2013.01);
(Continued)

(58) Field of Classification Search
USPC .................................. 327/147–149, 156–158
See application file for complete search history.

(56) References Cited

U.S. PATENT DOCUMENTS 6,791,906 B1 *   9/2004   Fischer ................... H03L 7/087
                                                        331/11
7,023,251 B2    4/2006   Starr
(Continued)

OTHER PUBLICATIONS

Wang, et al., "Spurious-Tone Suppression Techniques Applied to a Wide-Bandwidth 2.4GHz Fractional-N PLL," 2008 IEEE International Solid-State Circuits Conference; San Francisco, CA, USA; Feb. 3-Feb. 7, 2008; pp. 342-343 and 618; 3 pages.
(Continued)

*Primary Examiner* — Adam D Houston
(74) *Attorney, Agent, or Firm* — Meyertons, Hood, Kivlin, Kowert & Goetzel, P.C.

(57) ABSTRACT

An apparatus includes an oscillator, a frequency divider, a phase circuit, a charge pump, and a filter. The frequency divider may generate an early feedback signal using a clock signal, and may assert a feedback signal a number of periods of the clock signal after asserting the early feedback signal. The phase circuit may generate a charge control signal using a reference clock signal and the feedback signal, and may generate a discharge control signal using the early feedback signal, the reference clock signal, and the feedback signal. The charge pump may charge or discharge a circuit node using the charge control signal and the discharge control signal to generate a frequency control signal. The filter circuit may attenuate at least one frequency component of the frequency control signal. The oscillator circuit may modify a frequency of the clock signal using the frequency control signal.

20 Claims, 9 Drawing Sheets

(51) Int. Cl.
*H03L 7/183* (2006.01)
*H03L 7/191* (2006.01)
*H03L 7/099* (2006.01)

(52) U.S. Cl.
CPC .............. *H03L 7/183* (2013.01); *H03L 7/191* (2013.01); *H03L 7/1976* (2013.01)

(56) References Cited

U.S. PATENT DOCUMENTS

| | | | |
|---|---|---|---|
| 7,612,589 B2 | 11/2009 | Liu et al. | |
| 8,872,558 B1* | 10/2014 | Rey | H03L 7/087 327/149 |
| 2005/0062510 A1* | 3/2005 | Zarate | H03L 7/0814 327/158 |
| 2007/0018705 A1* | 1/2007 | Riley | H03D 13/004 327/199 |
| 2008/0008284 A1* | 1/2008 | Huang | H03L 7/087 375/376 |
| 2008/0246546 A1 | 10/2008 | Ha et al. | |
| 2009/0262878 A1 | 10/2009 | Sun et al. | |
| 2010/0156481 A1 | 6/2010 | Neumann | |
| 2011/0006936 A1* | 1/2011 | Lin | H03L 7/085 341/143 |
| 2011/0298506 A1 | 12/2011 | Salle et al. | |
| 2011/0304365 A1 | 12/2011 | Bunch | |
| 2012/0074995 A1 | 3/2012 | Zhang | |
| 2012/0206178 A1* | 8/2012 | Balasubramanian | H03L 7/0812 327/158 |
| 2012/0280731 A1* | 11/2012 | Rhee | H03L 7/087 327/157 |
| 2014/0003102 A1 | 1/2014 | Kerkman et al. | |
| 2014/0266341 A1* | 9/2014 | Jang | H03L 7/085 327/156 |
| 2014/0333351 A1 | 11/2014 | Ba et al. | |
| 2015/0162921 A1 | 6/2015 | Chen et al. | |
| 2015/0381190 A1* | 12/2015 | Goyal | H04B 1/40 455/76 |
| 2016/0118990 A1 | 4/2016 | Faisal et al. | |
| 2016/0182067 A1 | 6/2016 | Liu | |
| 2016/0211855 A1* | 7/2016 | Unruh | H03L 7/1974 |
| 2017/0237444 A1 | 8/2017 | Wei et al. | |

OTHER PUBLICATIONS

Z. Tang, et al., "A 50-to-930MHz Quadrature-Output Fractional-N Frequency Synthesizer with 770-to-1860MHz Single-Inductor LC-VCO and Without Noise Folding Effect for Multistandard DTV Tuners," ISSCC 2013; pp. 358-359; 3 pages.

* cited by examiner

DIGITAL LINEARIZATION TECHNIQUE FOR CHARGE PUMP BASED FRACTIONAL PHASED-LOCKED LOOP

The present application is a continuation of U.S. application Ser. No. 15/421,884, filed Feb. 1, 2017 (now U.S. Pat. No. 9,954,542), which is incorporated by reference herein in its entirety.

BACKGROUND

Technical Field

Embodiments described herein are related to the field of integrated circuit implementation, and more particularly to the implementation of closed-loop oscillator circuits.

Description of the Related Art

Systems-on-a-chip (SoCs) designs may include one or more closed-loop oscillator circuits, configured to output a clock signal at a target frequency or to modulate a carrier signal using frequency modulation (FM) encoding. Closed-loop oscillator circuits may utilize a reference clock to generate output clock signals of a different frequency than the reference clock. In some embodiments, the target frequency may be programmable, allowing a processor in the SoC to adjust the clock frequency to a suitable value for current operating conditions, e.g., set a low frequency value to conserve power when fewer tasks are active, or vice versa. Some examples of such closed-loop clock generators include phase-locked loops (PLLs), delay-locked loops (DLLs), and frequency-locked loops (FLLs).

Some PLL circuits generate a clock signal with a frequency that is a fractional multiple of a reference clock frequency, e.g., 3.5 times the reference clock frequency. This may be achieved by changing a divisor value in a feedback loop between two or more integer divisor values. Switching between these two or more integer values, however, may generate quantization noise. A delta-sigma modulator (DSM) may be used to move a frequency of this quantization noise to higher frequencies such that the PLL circuit can filter out at least some of the quantization noise, a process referred to as "noise shaping." In a charge-pump based PLL, if charging and discharging characteristics of the charge pump are not evenly matched, this nonlinearity may reduce the effectiveness of the DSM noise shaping, causing more of the frequencies of the quantization noise to fall within the PLL bandwidth, thereby increasing output clock jitter.

SUMMARY OF THE EMBODIMENTS

Various embodiments of a clock generation unit are disclosed. Broadly speaking, a system, an apparatus, and a method are contemplated in which the apparatus includes an oscillator circuit, a frequency divider circuit, a phase circuit, a charge pump circuit, and a filter circuit. The oscillator circuit may be configured to generate a clock signal. The frequency divider circuit may be configured to generate an early feedback signal using the clock signal, and to assert a feedback signal a number of periods of the clock signal after an assertion of the early feedback signal. The phase circuit may be configured to generate a charge control signal using a reference clock signal and the feedback signal, and to generate a discharge control signal using the early feedback signal, the reference clock signal, and the feedback signal. The charge pump circuit may be configured to selectively charge or discharge a circuit node using the charge control signal and the discharge control signal to generate a frequency control signal. The filter circuit may be configured to attenuate at least one frequency component included in the frequency control signal. The oscillator circuit may be further configured to modify a frequency of the clock signal using the frequency control signal.

In a further embodiment, the phase circuit may be further configured to assert the charge control signal in response to an assertion of the reference clock signal, and to assert the discharge control signal in response to an assertion of the early feedback signal. In an embodiment, the phase circuit may be further configured to de-assert the charge control signal and the discharge control signal based on an assertion of the feedback signal.

In another embodiment, a frequency of the early feedback signal may be based on a divisor value used by the frequency divider circuit. The divisor value may be an integer. In a further embodiment, the apparatus may include a modulation circuit configured to adjust the divisor value by an integer value.

In one embodiment, a frequency of the clock signal may correspond to a non-integer multiple of a frequency of the reference clock signal. In an embodiment, the number of periods of the clock signal may be programmable.

BRIEF DESCRIPTION OF THE DRAWINGS

The following detailed description makes reference to the accompanying drawings, which are now briefly described.

Figure 1:
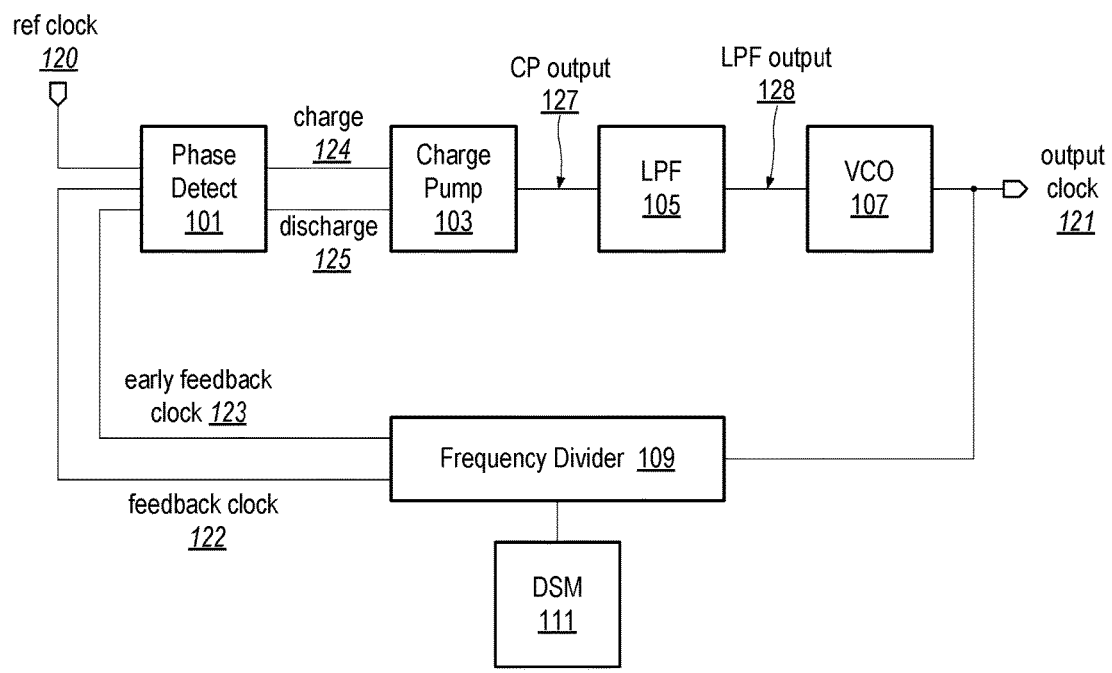
FIG. 1 illustrates a block diagram of an embodiment of a clock generation circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

In a fractional phase-locked loop (PLLs), a frequency of an output clock signal is based on a non-integer (i.e., fractional) multiple of a reference clock signal. A fractional PLL may generate a frequency of the output clock signal by switching between two or more integer values of a feedback signal in a frequency divider circuit such that the frequency of the output clock signal averages to a fractional value over a period of time. A delta-sigma modulator (DSM) may be used to move a frequency of this quantization noise to higher frequencies such that the loop filter circuits can more effectively filter out the quantization noise. The process of moving the frequency of the quantization noise to higher frequencies is referred to herein as "noise shaping." In a charge-pump based PLL, non-linear characteristics of the charge pump may reduce the effectiveness of the DSM noise shaping, causing more quantization noise to fall within frequencies in the PLL bandwidth, thereby increasing output clock jitter.

The various embodiments illustrated in the drawings and described below describe a digital linearization technique that may allow a clock generation circuit to compensate for a charge pump circuit with non-linear characteristics. These embodiments may employ techniques that mitigate the non-linearity of a charge pump circuit when using a fractional divisor value, thereby reducing jitter of the output clock signal and potentially reducing a power consumption and a circuit area compared to other mitigating techniques.

A block diagram of an embodiment of a clock generation circuit is illustrated in FIG. 1. Clock generation circuit 100 may represent a closed-loop clock generation circuit capable of generating an output clock signal at a frequency that is a fractional multiple of a frequency of a received reference clock, such as, for example, a fractional PLL circuit. In the illustrated embodiment, Clock Generation Circuit 100 includes Phase Detect 101 coupled to Charge Pump 103 via charge signal 124 and discharge signal 125. Charge Pump 103 is coupled to low pass filter (LPF) 105, which is, in turn, coupled to voltage controlled oscillator (VCO) 107, which is then coupled to Frequency Divider 109. Frequency Divider 109 is further coupled to Delta-Sigma Modulator (DSM) 111. Phase Detect 101 receives reference clock (ref clock) 120 and two output signals of Frequency Divider 109, feedback clock 122 and early feedback clock 123.

Clock generation circuit 100 generates output clock 121 dependent upon ref clock 120. In one embodiment, clock generation circuit 100 is programmed to generate output clock 121 at a target frequency greater than the frequency of ref clock 120. In other embodiments, clock generation circuit 100 may be programmed to generate output clock 121 at a target frequency greater than or less than the frequency of ref clock 120. Output clock 121 is generated by VCO 107.

Frequency Divider 109 receives output clock 121 and generates feedback clock 122 and early feedback clock 123. Feedback clock 122, in the illustrated embodiment, is generated by Frequency Divider 109 by counting a number of periods of output clock 121 stating from an initial value, counting to a final value, and then restarting at the initial value. A time for Frequency Divider 109 to count from an initial value to a final value is referred to herein as a "counting cycle." Frequency Divider 109 asserts feedback clock 122 upon a count value reaching a first threshold value, between the initial and final values. Feedback clock 122 is de-asserted after the count value reaches a second threshold value. Early feedback clock 123 is asserted upon the count value reaching a third threshold value that occurs some number of periods before the first threshold value. The offset between the first threshold value and the third threshold value may, in some embodiments, be programmable and set prior to enabling Clock Generation Circuit 100. This offset may remain at the programmed value while Clock Generation Circuit 100 is in operation. Both feedback clock 122 and early feedback 123 may be de-asserted at the same time, such as, for example, upon Frequency Divider 109 reaching the final value. Additional details of the operation of Frequency Divider 109 are provided below.

It is noted that, in some embodiments, Frequency Divider 109 may be set to assert early feedback clock 123 zero periods ahead of feedback clock 122. In other words, Frequency Divider 109 may be capable of generating early feedback clock 123 and feedback clock 122 to transition high and low at the same time. This may allow Clock Generation Circuit 100 to operate in a traditional mode in which early feedback clock 123 and feedback clock 122 are essentially two versions of the same clock signal.

Phase Detect 101 receives feedback clock 122, early feedback clock 123 and ref clock 120. Ref clock 120 may be generated by any suitable clock source, such as, e.g., a crystal oscillator circuit or an output of another PLL, configured to generate ref clock 120 at a known constant frequency with a desired level of accuracy. Phase Detect 101 determines phase differences between ref clock 120, feedback clock 122, and early feedback clock 123. In various embodiments, Phase Detect 101 may be referred to as a "phase detector" or "phase-frequency detector."

In the illustrated embodiment, Phase Detect 101 generates two output signals, charge and discharge. Charge signal 124 is asserted high when a rising transition (also referred to as a rising edge) occurs on ref clock 120. A length of time that charge signal 124 remains asserted may depend upon which signal is asserted first, ref clock 120 or feedback clock 122. If ref clock 120 is asserted first, then charge signal 124 may be asserted for at least the time between the rising edge of ref clock 120 and the rising edge of feedback clock 122, i.e., a phase difference between ref clock 120 and feedback clock 122. Charge signal 124, in this case, is de-asserted after detecting an assertion of feedback clock 122. An additional delay may be included after the assertion of feedback clock 122 before charge signal 124 is de-asserted. If feedback clock 122 is asserted before ref clock 120, then charge signal 124 may be asserted only for the duration of the additional delay time.

Assertion of charge signal 124 causes Charge Pump 103 to increase a voltage level of CP output 127, which in turn, may cause a corresponding increase in a voltage level of LPF output 128. VCO 107, in the illustrated embodiment, increases the frequency of output clock 121 in response to an increased voltage level of LPF output 128. Conversely, VCO 107 decreases the frequency of output clock 121 in response to a decreased voltage level of LPF output 128.

In the illustrated embodiment, discharge signal 125 is asserted high when a rising edge on early feedback clock 123 occurs. Discharge signal 125 is de-asserted in response to a same signal as charge signal 124, thereby de-asserting at a similar time as charge signal 124. Early feedback clock 123 asserts before feedback clock 122 by one or more periods of output clock 121. Assertions of discharge signal 125 may overlap assertions of charge signal 124. When both charge signal 124 and discharge signal 125 are asserted, CP output 127 may be neutral, i.e., the voltage level of CP output 127 may not change significantly and, therefore, the voltage level of LPF output 128 may not change significantly. In other embodiments, however, the charging and discharging characteristics of Charge Pump 103 may not be balanced, and either a charging current supplied by Charge Pump 103 or a discharge current drawn by Charge Pump 103 may be larger than the other, causing the Clock Generation Circuit 100 to lock with a static phase offset.

If the rising edge of early feedback clock 123 occurs after the rising edge of ref clock 120, then the frequency of output clock 121 may be lower than the target frequency and, therefore, need to be increased. Charge signal 124 remains asserted until after feedback clock 122 is asserted. The longer the time period between ref clock 120 asserting and feedback clock 122 asserting, the longer charge signal 124 remains asserted. The more time that charge signal 124 is asserted before discharge signal 125 is asserted, then the more the frequency of output clock 121 may be increased. To the contrary, if the rising edge of early feedback clock 123 occurs before the rising edge of ref clock 120, then the frequency of output clock 121 may be higher than the target frequency and, accordingly, need to be decreased. Discharge signal 125 asserts before feedback signal 122 due to the earlier assertion of early feedback clock 123. Discharge signal 125 de-asserts after both ref clock 120 and feedback clock 122 are asserted. The farther ref clock 120 asserts after early feedback clock 123, the longer discharge signal 125 remains asserted, and, therefore, the more that the frequency of output clock 121 is decreased.

Charge Pump 103 receives the charge signal 124 and discharge signal 125 from Phase Detect 101 and generates CP output 127 with a voltage level dependent upon the two outputs. When charge signal 124 is asserted, then Charge Pump 103 sources current into CP output 127. Conversely, when discharge signal 125 is asserted, then Charge Pump 103 draws or sinks current from CP output 127. CP output signal 127 is received by LPF 105. LPF 105, in the illustrated embodiment, may include any suitable combination of circuit elements that allows signals with frequencies lower than a desired cutoff frequency to pass through to the output while attenuating signals with frequencies higher than the desired cutoff frequency.

While the current of CP output 127 may change relatively quickly in response to changes in charge signal 124 and discharge signal 125, in the illustrated embodiment, a voltage level of the output of LPF 105, LPF output 128, changes more slowly in comparison to CP output 127. When both Charge signal 124 and Discharge signal 125 are asserted or de-asserted, the voltage level of CP output 127 may remain constant. Due to the slower response of LPF 105, for LPF output 128 to rise to a higher voltage level within a given time period, CP output 127 must remain at a higher voltage level for a majority of the given time period, and vice versa for the voltage level to fall to a lower voltage level. In other words, brief, high frequency pulses are filtered out of LPF output 128.

LPF output 128 is sent to VCO 107. VCO 107 generates output clock 121 at a frequency that is dependent upon the voltage level of LPF output signal 128. In one embodiment, a higher voltage level received by VCO 107 corresponds to a higher frequency of output clock 121 and to the contrary for lower voltage level of LPF output 228. Output clock 121, in the illustrated embodiment, is received by Frequency Divider 109.

In the illustrated embodiment, Frequency Divider 109 generates feedback clock 122 and early feedback clock 123 as described above. Feedback clock 122 and early feedback clock 123 are derived from output clock 121 dependent upon settings for Frequency Divider 109, including a divisor value. The divisor value may include select integer values within a predetermined range. Feedback clock 122 and early feedback clock 123 are generated with a frequency equal to the frequency of output clock 121 divided by the divisor value.

DSM 111, in the illustrated embodiment, may correspond to a second-order delta-sigma modulator circuit. In order for the frequency of output clock 121 to achieve a fractional multiple of the frequency of ref clock 120, DSM 111, in the illustrated embodiment, adjusts the divisor value of Frequency Divider 109. For example, to generate output clock 121 at a frequency that is 9.4 times higher than the frequency of ref clock 120, DSM 111 may adjust the divisor value of Frequency Divider 109 between nine and ten, such that forty percent of the periods of feedback clock 122 are generated with a divider value of ten and sixty percent are generated with a divider value of nine, thereby averaging out to a divisor value of 9.4. If, however, DSM 111 uses a repetitive pattern to alternate between divisor values of nine and ten, then output clock 121 may include undesirable characteristics such as spurious noise (also referred to as noise spurs) corresponding to a frequency of the repetition of the pattern. DSM 111 may, therefore, use more divisor values than simply nine and ten, such as, for example, eight, nine, ten, and eleven, as would be the case of a second-order delta-sigma modulator circuit, such as DSM 111. In addition, DSM 111 may alternate between these four divisor values without using a repeating pattern, or using a pattern that repeats infrequently. This operation of DSM 111 may move the quantization noise to higher frequencies that may be filtered out by LPF 105.

In the illustrated embodiment, clock generation circuit 100 is in a locked state once corresponding edges of ref clock 120 and early feedback clock 123 occur within a predetermined amount of time (sometimes called phase error between ref clock 120 and early feedback clock 123) of one another for every cycle of these two clock signals. An acceptable amount of phase error, and, therefore, the accuracy of output clock 121, may be determined during design of clock generation circuit 100 to establish an acceptable level of accuracy for intended uses of output clock 121.

It is noted that the embodiment of clock generation circuit 100 as illustrated in FIG. 1 is merely an example. The illustration of FIG. 1 has been simplified to highlight features relevant to this disclosure. Various embodiments may include different configurations of the circuit bocks, including additional circuit blocks. Furthermore, although a PLL is used in the examples, the features described may apply to any suitable embodiment of a closed loop clock generation circuit, such as, a DLL, for example.

Figure 2:
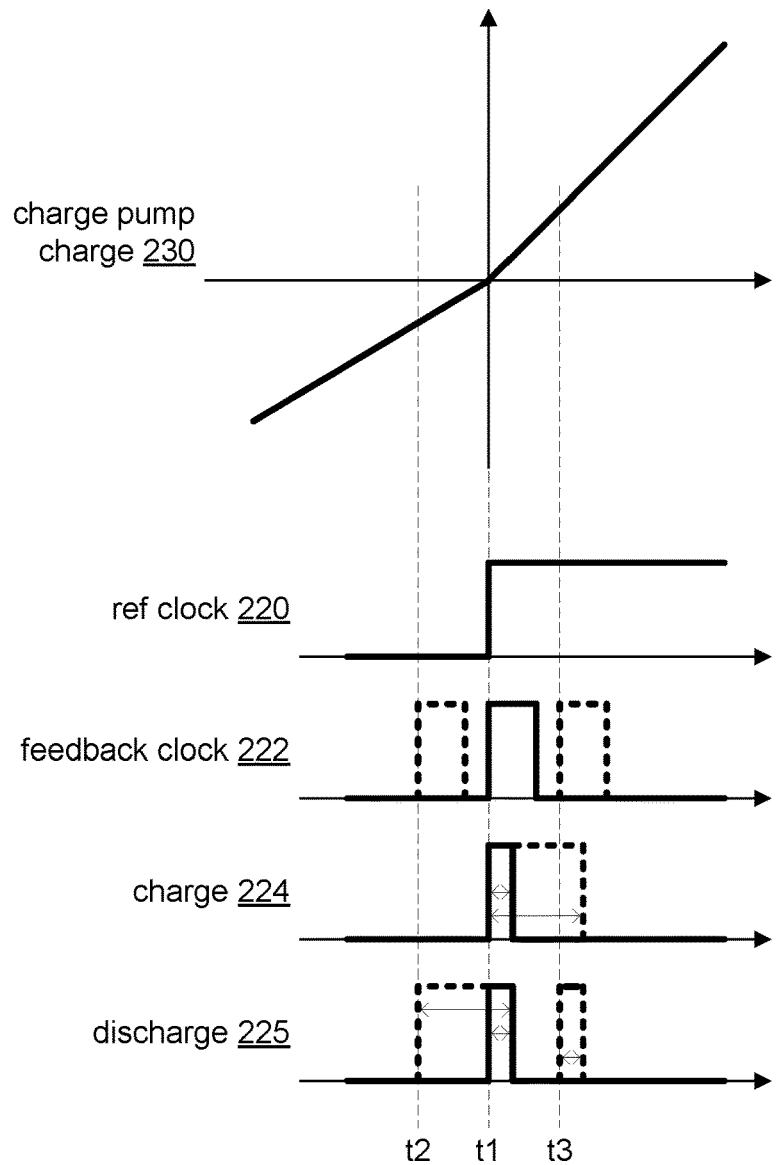
FIG. 2 depicts a first chart showing an example of waveforms associated with a clock generation circuit.

Moving to FIG. 2, a first chart showing an example of waveforms associated with a clock generation circuit is depicted. The clock generation circuit may correspond to a traditional fractional PLL circuit without an early feedback clock signal, or to Clock Generation Circuit 100 operating in the traditional mode, i.e., with no delays between transitions of early feedback clock 123 and feedback clock 122. In the illustrated embodiment, the waveforms of Chart 200 show a response curve of a charge pump circuit. In addition, signals ref clock 220, feedback clock 222, charge 224, and discharge 225 are illustrated relative to the charge pump response curve. Three variations of timing are indicated on feedback clock 222, illustrating a different phase alignment in relation to ref clock 220. The solid pulse in the middle, starting at time t1 is shown with no phase offset to ref clock 220, e.g., in a locked state. An early dashed pulse, starting at time t2, shows feedback clock 222 leading ref clock 220. A late dashed pulse, starting at time t3, shows feedback clock 222 trailing ref clock 220. The solid pulses of charge 224 and discharge 225 indicate the signals when feedback clock 222 is locked with ref clock 220. The dashed lines in charge 224 and discharge 225 indicate changes due to feedback clock 222 being leading or trailing ref clock 220. Waveforms ref clock 220, feedback clock 222, charge 224, and discharge 225 depict a logic level versus time. Charge pump charge 230 shows an integrated amount of charge versus a phase difference between ref clock 220 and feedback clock 222.

In the illustrated embodiment, the charge pump represented in FIG. 2 provides charge to a low pass filter when charge 224 is asserted and discharge 225 is de-asserted, and draws charge from the low pass filter when the opposite is true. In a traditional PLL, charge 225 may be asserted when ref clock 220 is asserted and de-asserted after a delay once both feedback clock 222 and ref clock 220 are asserted. Similarly, discharge 225 may be asserted when feedback clock 222 is asserted. Discharge 225 may be de-asserted in response to the same signal as charge 224. Therefore, when ref clock 220 leads feedback clock 222, charge 224 is asserted for longer than discharge 225, and the charge pump is operating in the positive (right-hand) half of the response curve of charge pump charge 230, and vice versa when feedback clock 222 leads ref clock 220.

The response curve for charge pump charge 230 shows nonlinearity when crossing the y-axis, i.e., when charge pump charge 230 changes from sourcing charge to drawing charge. In some embodiments, charge may be drawn from a low pass filter by a first device or circuit, while charge is sourced to the low pass filter by a second device or circuit. Although, in some embodiments, these first and second devices may be designed to provide a linear response when crossing the x-axis, various conditions may cause this non-linearity. For example, the non-linear response of charge pump charge 230, such as illustrated in FIG. 2, may be caused by any of: inconsistencies in semiconductor manufacturing, an inherent design mismatch, operating temperature, operating supply voltage, differences in output impedance, sensitivity to CP output 127 voltage, and the like.

When the traditional PLL is in a locked state, the phase difference between ref clock 220 and feedback clock 222 is close to zero, such as at time t1. Charge 224 and discharge 225 assert in response to the assertions of ref clock 220 and feedback clock 222, respectively. Both charge 224 and discharge 225 de-assert at a same time, after a delay from both ref clock 220 and feedback clock 222 asserting. Due to charge 224 and discharge 225 asserting and de-asserting at the same time, the charge pump may not source or sink a significant amount of charge, leaving a voltage level of a low pass filter output mostly unchanged. A frequency of an output clock, therefore, may not change either.

As the phase difference moves to negative values, as shown at time t2, discharge 225 is asserted from time t2 to the delay time after time t1. Charge 224, in contrast, is asserted for a similar amount of time as when locked, from time t2 to the delay time after t1. The charge pump, as a result, draws charge from the low pass filter as indicated by the negative value of the curve of charge pump charge 230 at time t2.

When the phase difference between ref clock 220 and feedback clock 222 moves to positive values, such as shown time t3, then charge 224 is asserted for a longer amount of time, from time t1 to a delay time after time t3. Discharge 225, on the other hand, is only asserted from time t3 until the same delay time after time t3. As a result, the charge pump provides charge to the low pass filter, as indicated by the positive value of the curve of charge pump charge 230 at time t3. It is noted that the pulse widths of both charge 224 and discharge 225 vary depending on if ref clock 220 is leading, locked to, or trailing feedback clock 222.

As disclosed above, to generate an output clock at a frequency that is a non-integer multiple of ref clock 220, a divisor value for the PLL is adjusted between two or more integer values. In the illustrated embodiment, the divisor value may be adjusted by −1, 0, +1, or +2 for a given counting cycle by DSM 111. These adjustments may cause phase offsets, or phase differences, such as shown between ref clock 220 and the various pulses of feedback clock 222. These phase offsets may cause operation of the charge pump to switch from one side of the charge pump charge curve 230 to the other. The non-linearity of charge pump charge 230, however, may reduce the effectiveness of DSM noise shaping, causing more noise to fall in-band within the traditional PLL's loop bandwidth in the traditional PLL, known as "noise folding".

It is noted that Chart 200 of FIG. 2 is merely an example of possible signals resulting from one embodiment of a traditional PLL circuit. The signals are illustrated in a clear, simple format to demonstrate the disclosed concepts. In other embodiments, the waveforms of FIG. 2 may appear different than illustrated, and may include some voltage ringing and/or other signal noise.

Figure 3:
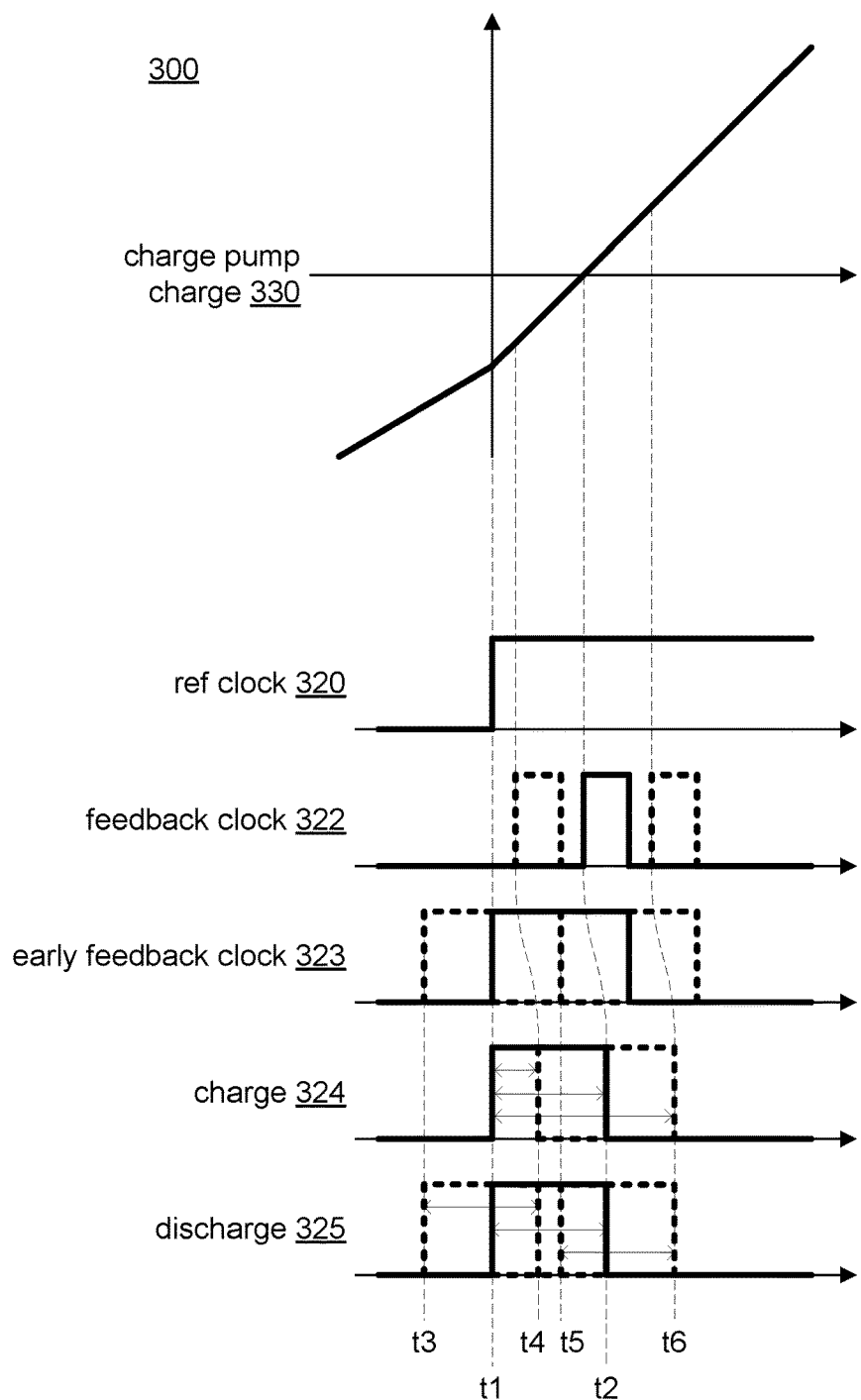
FIG. 3 shows a second chart illustrating an example of waveforms associated with a clock generation circuit.

Turning to FIG. 3, a second chart showing an example of waveforms associated with a clock generation circuit is illustrated. The waveforms of FIG. 3 may correspond to Clock Generation Circuit 100 operating with a delay between transitions of early feedback clock 123 and feedback clock 122, employing a digital linearization technique disclosed herein. Similar to Chart 200 in FIG. 2, the waveforms of Chart 300 show charge pump charge 330, a response curve of a charge pump circuit, such as, e.g., Charge Pump 103 in FIG. 1. Additional waveforms are shown, including ref clock 320, feedback clock 322, early feedback clock 323, charge signal 324, and discharge signal 325. Charge pump charge 330 illustrates an integrated amount of charge versus a phase difference between ref clock 320 and feedback clock 322. Ref clock 320, feedback clock 322, early feedback clock 323, charge signal 324, and discharge signal 325 represent a logic level versus time.

Chart 300 is similar to Chart 200 in that various phase differences between ref clock 320 and feedback clock 322 are shown by the dashed waveform pulses in comparison to the response curve for an embodiment of Charge Pump 103. Charge pump charge 330 crosses the x-axis at a different point than charge pump charge 230. Charge pump charge 230 crosses the x-axis when the phase difference between ref clock 220 and feedback clock 222 is near zero. Charge pump current 330, however, crosses the x-axis while the phase difference between ref clock 320 and feedback clock 322 is greater than zero. The response curve for charge pump charge 330 is effectively shifted down. This is achieved by using early feedback clock 323 to lock to ref clock 320 rather than feedback clock 222, as shown by the rising edge of early feedback clock 323 aligning with the rising edge of ref clock 320. By selecting different delays between feedback clock 322 and early feedback 323, the point at which charge pump charge 330 crosses the x-axis may be set as desired.

When Clock Generation Circuit 100 is locked, both ref clock 320 and early feedback clock 323 are asserted at time t1. In response, charge signal 324 is asserted due to the assertion of ref clock 320, while, at approximately the same time, discharge signal 325 is asserted due to the assertion of early feedback clock. Both charge signal 324 and discharge signal 325 remain asserted until time t2, corresponding to a delay after feedback clock 322 is asserted. The pulse widths of charge 324 and discharge 325 are the same, and, therefore, no charge is sourced to, or drawn from, LPF 105.

When early feedback clock 323 asserts at time t3, it leads ref clock 320. Discharge signal 325 asserts, in response to early feedback clock 323, at time t3, and remains asserted until time t4, corresponding to a delay after feedback clock 322 is asserted. Charge signal 324 asserts after discharge signal 325, at time t1 when ref clock 320 is asserted. Charge signal 324 is de-asserted at the same time as discharge signal 325, at time t4. As a result, discharge signal 325 remains asserted for a longer period of time than charge signal 324, and Charge Pump 103 draws charge from LPF 105.

When early feedback clock 323 asserts at time t5, it trails ref clock 320 which asserts at time t1. Charge signal 324 asserts, again, at time t1 and remains asserted until time t6, corresponding to a delay after feedback clock 322 is asserted. Discharge signal 325 is asserted at time t5 in response to early feedback clock 323 asserting. Discharge signal 325 de-asserts at time t6, same as charge signal 324. Charge signal 324, therefore, remains asserted for a longer period of time than discharge signal 325, and, as a result, Charge Pump 103 provides charge to LPF 105.

It is noted that, in the three illustrated cases (locked, ref clock 320 trailing, and ref clock 320 leading), discharge signal 325 remains asserted for an equal duration each time. The time from t1 to t2, the time from t3 to t4, and the time from t5 to t6, are all based on the delay between early feedback clock 323 and feedback clock 322. This remains true as long as feedback clock 322 transitions at the same time as, or later than ref clock 320. The assertion time of charge signal 324, in contrast, varies in duration for each of the three illustrated cases. Charge signal 324 remains asserted longer than discharge 325 when ref clock 320 leads early feedback clock 323. Charge signal 324 is asserted a same amount of time as discharge 325 when ref clock 320 and early feedback clock 323 are locked. Charge signal 324 remains asserted for less time than discharge 325 when ref clock 320 trails early feedback clock 323. By asserting discharge 325 for a same amount of time in each of these cases, an amount of charge drawn by a discharging circuit in Charge Pump 103 remains consistent. A net amount of charge provided or drawn by Charge Pump 103 is determined by the variations in the duration of charge signal 324, limiting variations in the amount of charge to the positive half of charge pump charge 330.

Referring back to DSM 111 adjusting the divisor value by −1, 0, +1, +2 as described above for the traditional PLL case in FIG. 2, these four values now correspond to cases in which feedback clock 322 transitions after ref clock 320, as long as the delay between early feedback clock 323 and feedback clock 322 is set to a count of one or more. The operation of Charge Pump 103, therefore, is no longer sensitive to the nonlinearity, since only the charge 324 pulse is varying while discharge 325 pulse width is constant. Limiting pulse width changes to charge 324, therefore, may reduce the impact of charge pump nonlinearity, thereby reducing the noise-folding non-idealities, and as a result, reducing jitter in output clock 121.

It is also noted that Chart 300 of FIG. 3 illustrates examples of possible signals corresponding to an embodiment of Clock Generation Circuit 100. The signals are simplified to demonstrate concepts disclosed herein. In other embodiments, the waveforms shown in Chart 300 may appear different, and may include various forms of signal noise.

Figure 4:
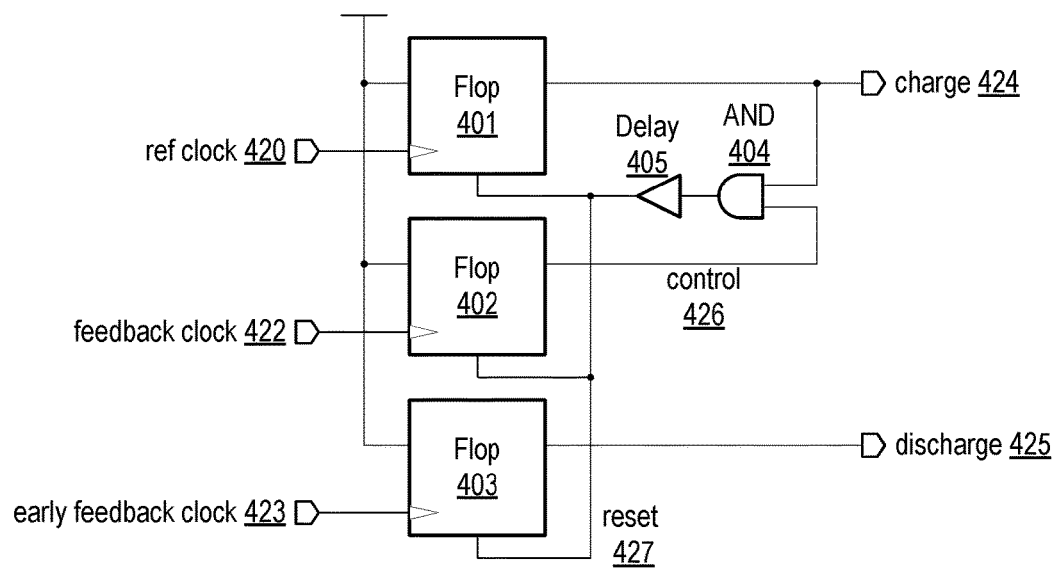
FIG. 4 illustrates a block diagram of an embodiment of a phase detection circuit.

Moving now to FIG. 4 a block diagram is illustrated of an embodiment of a phase detection circuit that may implement the operation described above in FIG. 3. In some embodiments, Phase Detection Circuit 400 may correspond to Phase Detect 101 included in Clock Generation Circuit 100 of FIG. 1. Phase Detection Circuit 500 includes flip-flop circuits Flops 401-403, logic circuit AND Gate 404, and Delay Circuit 405. Phase Detection Circuit 500 receives reference clock (ref clock) 420, feedback clock 422, and early feedback clock 423 as inputs. Output signals charge 424 and discharge 425 are generated.

In the illustrated embodiment, Phase Detection Circuit 400 generates signals charge 424 and discharge 425 based on received signals ref clock 420, feedback clock 422, and early feedback clock 423. Both charge 424 and discharge 425 may be received by a charging circuit, such as, for example, Charge Pump 103 in FIG. 1, and used to increase or decrease an amount of charge produced by Charge Pump 103, thereby leading to an increase or decrease in a frequency of output clock 121.

In a traditional PLL, if ref clock 420 transitions high before feedback clock 422, the frequency of output clock 121 is lower than a desired frequency and charge 424 should be asserted to increase the frequency of output clock 121. In contrast, if feedback clock 422 transitions high before ref clock 420, then the frequency of output clock 121 is higher than the desired frequency and, accordingly, discharge 425 should be asserted to decrease the frequency of output clock 121. Phase Detection Circuit 400, however, asserts discharge 425 in response to a rising transition of early feedback clock 423, rather than feedback clock 422. As described above in regards to FIG. 3, asserting discharge 425 based on early feedback clock 423 may shift an operating point of Charge Pump 103, which may, in some embodiments, compensate for undesirable effects caused by the nonlinearity of a charge pump circuit, such as described above in regards to FIG. 2.

In the illustrated embodiment, Flops 401-403 each have their respective data inputs coupled to a logic high level. A clock input for Flop 401 is coupled to ref clock 420, such that, upon a rising transition of ref clock 420, an output of Flop 401, corresponding to charge 424, is asserted high.

Similarly, a clock input for Flop 403 is coupled to early feedback clock 423. A rising transition on early feedback clock 423 results in discharge 425 (the output of Flop 403) being asserted. A clock input for Flop 402, similar to Flops 401 and 403, is coupled to feedback clock 402, causing control 426, an output of Flop 402, to assert upon a rising transition of feedback clock 422. AND gate 404 receives both charge 424 and control 426. An output of AND gate 404 is asserted high when both charge 424 and control 426 are asserted. Delay Circuit 405 asserts its output, reset 427, after a period of time elapses from the assertion of AND gate 404. An assertion of reset 427 causes Flops 401-403 to reset their respective outputs to logic low levels. Both charge 424 and discharge 425, therefore, are de-asserted at a same time. Charts illustrating possible waveforms corresponding to operation of Phase Detection Circuit 400 follow below.

Although Phase Detection Circuit 400, in the illustrated embodiment, utilizes flip-flop circuits for generating charge 424 and discharge 425, other suitable circuits may also be employed. For example, any or all of Flops 401-403 may be replaced with logic circuits, such as, e.g., various combinations NAND gates, NOR gates, or other logic gates. In other embodiments, dedicated circuit designs may be employed.

It is noted that FIG. 4 is merely an example of a phase detection circuit. The block diagram of FIG. 4 is simplified to highlight the disclosed features. In other embodiments, additional circuit blocks may be included. Although some signals are described as asserting or de-asserting "at a same time," variations in transistor rise and fall times may result in slight deviations in timing between two or more signals. As used herein, "at a same time" is intended to refer to two or more circuits reacting within a time period that is small compared to, for example, a system clock period.

Figure 5:
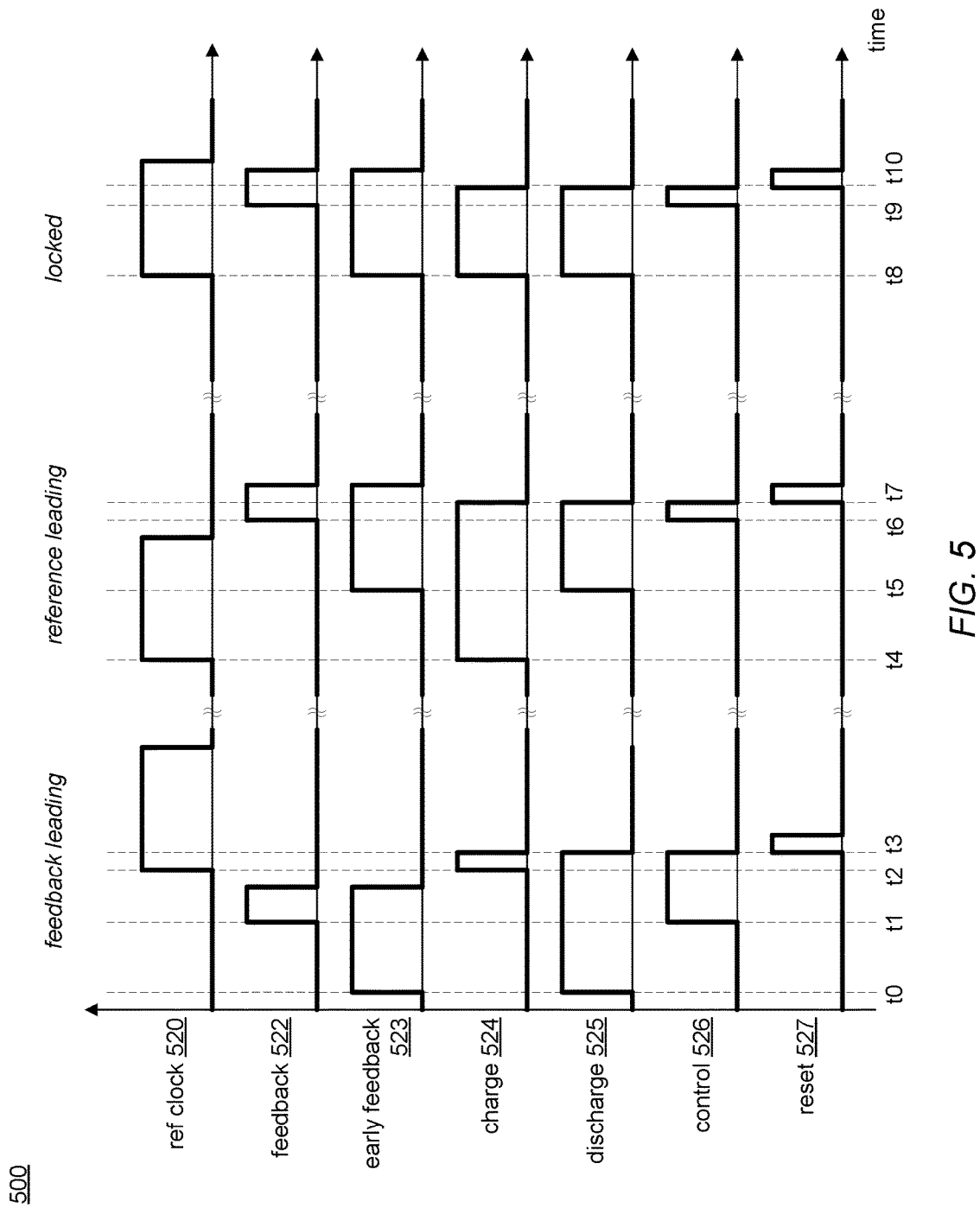
FIG. 5 shows a timing diagram illustrating possible waveforms of an embodiment of a clock generation circuit.

Turning now to FIG. 5, a timing diagram including possible waveforms of an embodiment of a clock generation circuit is illustrated. In the illustrated embodiment, FIG. 5 corresponds to waveforms associated with Phase Detection Circuit 400 in FIG. 4. Three examples are shown: "feedback leading" in which feedback clock 522 transitions before ref clock 520, "reference leading" in which ref clock 520 transitions before feedback early feedback clock 523, and "locked" in which the clock generation circuit is in a locked stated. The three examples, although presented together, may occur independently of each other. The waveforms may, in some embodiments, correspond to similarly named and numbered signals shown in FIGS. 1 and 4. The waveforms of timing diagram 500, in the illustrated embodiment, depict logic levels versus time and include ref clock 520, feedback clock 522, early feedback clock 523, charge 524, discharge 525, control 526 and reset 527. The waveforms of FIG. 5 are discussed collectively with Clock Generation Circuit 100 in FIG. 1 and Phase Detect Circuit 400 in FIG. 4.

Times t0-t3 illustrate an example of possible waveforms when feedback clock 522 leads ref clock 520. At time t0, a rising transition occurs on early feedback 523, causing discharge 525 to be asserted. The assertion of discharge 525 may cause Charge Pump 103 to draw or sink current from LPF 105, which, in turn, may cause a voltage level of LPF output 128 to decrease, leading to a respective decrease in a frequency of output clock 121. At time t1, a rising transition occurs on feedback clock 522. It is noted that the time period between the rising transitions of early feedback clock 523 and feedback clock 522 may correspond to a number of clock periods of output clock 121 as determined by a setting in Frequency Divider 109, such as described in regards to Frequency Divider 800 in FIG. 8. The rising transition of feedback clock 522 causes control signal 526 to assert high. As seen in FIG. 4, AND gate 404 receives both control 526 and charge 524. Since charge 524 remains low at time t1, the output of AND gate 404 remains low. At time t2, however, ref clock 520 transitions high, causing charge 524 to be asserted high. The output of AND gate 404 is asserted high, and then, after a delay caused by Delay Circuit 405, reset 527 is asserted high at time t3. The assertion of reset 527 causes Flops 401-403 to reset charge 524, discharge 525, and control 526 to logic low levels.

It is noted that a rising transition occurring on early feedback clock 523 before a corresponding rising transition on ref clock 520 may indicate that a current frequency of output clock 121 is higher than a desired frequency. Under these conditions, discharge 525 is asserted high for a longer period of time than charge 524 as indicated by times t0 to t3, which may result in a net loss of charge from LPF 105 and a corresponding reduction in the voltage level of LPF output 128. VCO 107, as a result, reduces the frequency of output 121.

Times t4-t7, which are independent from times t0-t3, illustrate an example of possible waveforms when ref clock 520 leads early feedback clock 523. At time t4, ref clock 520 transitions high. Charge 524 is asserted high via Flop 401 in response. The assertion of charge 524 may cause Charge Pump 103 to source current to LPF 105, which, in turn, may cause the voltage level of LPF output 128 to increase, leading to a respective increase in the frequency of output clock 121. At time t5, a rising transition occurs on early feedback clock 523, causing discharge 525 to be asserted high via Flop 403. At this point, both charging and discharging circuits in Charge Pump 103 are on and no charge is sourced to or drawn from LPF 105. At time t6 feedback clock 522 transitions high, causing control 526 to be asserted high via Flop 402. Since both control 526 and charge 524 are asserted high, the output of AND gate 404 is asserted high. After a delay through Delay Circuit 405, reset 527 is asserted high at time t7. Charge 524, discharge 525, and control 526 are each reset to a logic low level.

It is noted that a rising transition occurring on ref clock 520 before a corresponding rising transition on early feedback clock 523 may indicate that a current frequency of output clock 121 is lower than the desired frequency. Under these conditions, charge 524 is asserted high for a longer period of time than discharge 525, as shown from t4 to t7, which may result in a net gain of charge onto LPF 105 and a corresponding increase in the voltage level of LPF output 128. VCO 107, as a result, increases a frequency of output 121.

Times t8-t10, which are independent from times t0-t7, illustrate an example of possible waveforms when Clock Generation Circuit 100 is in a locked state. At time t8, both ref clock 520 and early feedback 523 transition high. In response, both charge 524 and discharge 525 are asserted high. The assertion of both charge 524 and discharge 525 may cause Charge Pump 103 to source and sink current to LPF 105 in parallel, resulting in no significant change to the voltage level of LPF output and, therefore, no significant change to the frequency of output clock 121.

At time t9, a rising transition occurs on feedback clock 522, causing control 526 to be asserted high. Both control 526 and charge 524 are asserted high and, therefore, the output of AND gate 404 is asserted high. After the delay through Delay Circuit 405, reset 527 is asserted high at time t10. Charge 524, discharge 525, and control 526 are each reset to a logic low level.

It is noted that the asserted duration of discharge 525 is the same as in the reference leading and locked examples. By using early feedback clock 523 to assert discharge 525 and making the de-assertion of discharge dependent on an assertion of feedback clock 522, the asserted duration of discharge 525 will be the same as long as the rising edge of ref clock 520 occurs before the rising edge of feedback 522. In contrast, the duration of charge 524 varies in each of the examples. This duration of discharge 525, in the illustrated embodiment, contributes to the shift of the charge pump response curve as previously described in regards to FIG. 3. By keeping discharge 525 assertions consistent and varying the duration of charge 524, operation of Charge Pump 103 may be kept in the positive region of charge pump current 330, when Clock Generation Circuit 100 is operating in a locked or near a locked state when DSM 111 is in use to achieve a fractional frequency multiple of ref clock 320.

It is also noted that timing diagram 500 of FIG. 5 is an example of possible signals resulting from one embodiment of clock generation circuit 100. The signals are simplified to clearly demonstrate the disclosed concepts. In other embodiments, the waveforms of FIG. 5 may appear different than illustrated. For example, rise and fall times of any of the signals may be longer than shown. In addition, some voltage ringing and/or other signal noise may be present on any of the waveforms.

Figure 6:
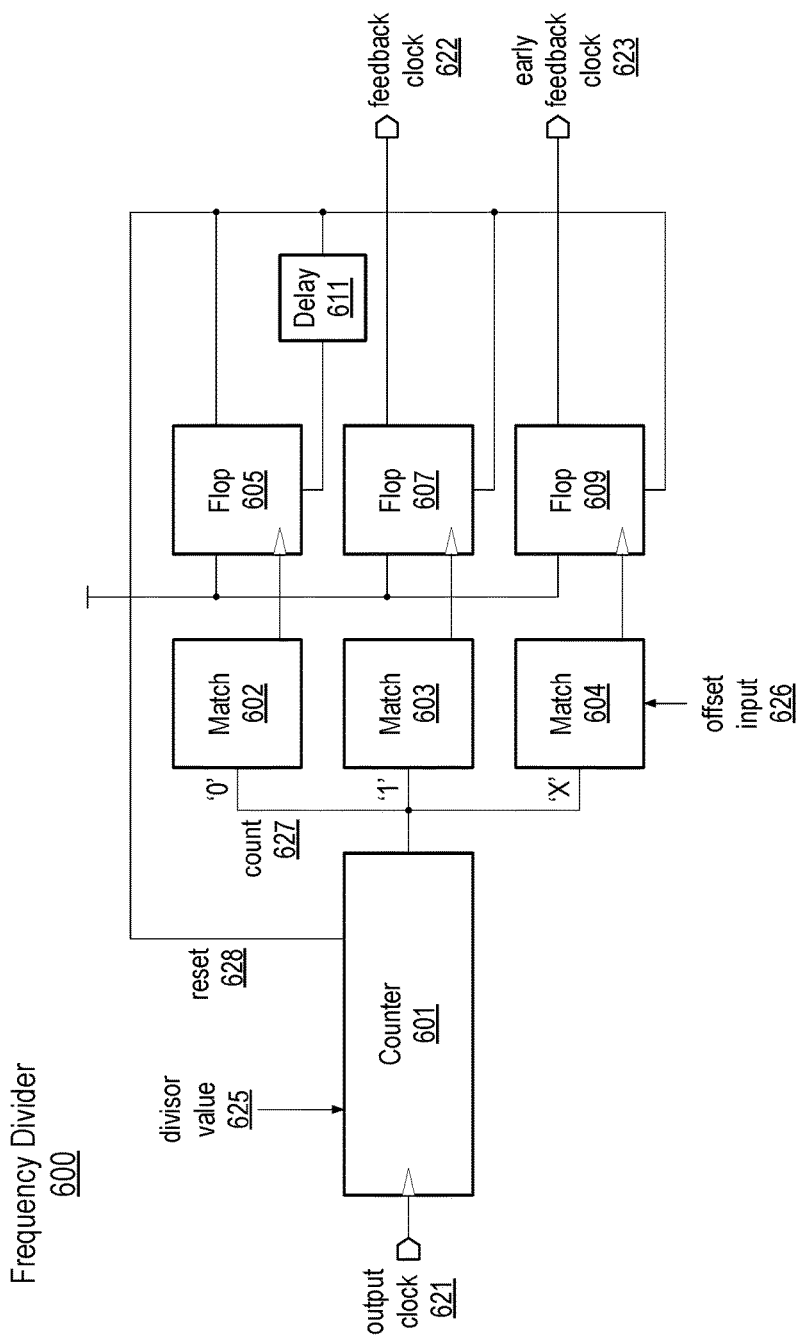
FIG. 6 depicts a block diagram of an embodiment of a frequency divider circuit.

Turning to FIG. 6 a block diagram of an embodiment of a frequency divider circuit is depicted. Frequency Divider 600 represents an example of one embodiment of Frequency Divider 109 in Clock Generation Circuit 100 of FIG. 1. In the illustrated embodiment, Frequency Divider 600 includes counter circuit (Counter) 601, and match detection circuits (Match) 602, 603, and 604. Three flip-flop data latches (Flops) 605, 607, and 609 as well as Delay Circuit (Delay) 611 are also included in Frequency Divider 600. Output clock 621 (corresponding to output clock 121 in FIG. 1), divisor value 625, and offset input 626 are signals received by Frequency Divider 600. Reset signal 628 and count value 627 are signals generated and used internally in Frequency Divider 600, while feedback clock 622 and early feedback clock 623 (corresponding to feedback clock 122 and early feedback clock 123 from FIG. 1, respectively) are generated as output signals.

Counter 601 receives divisor value 625 from another circuit in Clock Generation Circuit 100, such as, for example, DSM 111. In various embodiments, Counter 601 may count up to divisor value 625 from zero, or count down to zero beginning at divisor value 625. In the illustrated embodiment, Counter 601 receives divisor value 625 and loads a storage register with this received value. At a beginning of a counting cycle, the stored divisor value is copied from the storage register into a count register. Upon a rising transition of output clock 621 (or falling transition in other embodiments) the value of the count register is decremented. Count value 627 reflects a current value of the count register.

Each of Match circuits 602-604 includes circuits for comparing count value 627 with a predetermined value, asserting a respective output signal while the values match. Each Match circuit 602-604 may compare count value 627 to a different value. In the illustrated embodiment, Match 602 compares to a value of zero, and Match 603 compares to a value of one. Match 604 compares to a value greater than one that is received from offset input 626, and may, therefore, be programmable. This programmable value may determine an offset between early feedback clock 623 and feedback clock 622. In other embodiments, Match 603 may compare to a value greater than one, and the value that Match 604 uses remains greater than the value used in Match 603 by the value of offset input 626.

As count value 627 decrements from divisor value 625 towards zero, Match 604 will match the value of offset input 626 first, causing a clock input to Flop 609 to transition high. In response to the transition on the output of Match 604, Flop 609 latches the high value at its input and sets its output, early feedback clock 623, high. The combination of Match 603 and Flop 607 performs a similar function, asserting feedback clock 622 high upon a rising transition of an output of Match 603 that occurs upon count value 627 reaching one. Similarly, the combination of Match 602 and Flop 605 asserts reset signal 628 upon count 627 reaching zero. In response to the assertion of reset signal 628, Flops 607 and 609 reset to a low state, thereby de-asserting both feedback clock 622 and early feedback clock 623. Counter 601 also enters a reset state in which a new divisor value is copied from the storage register into the count register again. Counter 601 repeats the process of decrementing in response to rising transitions of output clock 621.

Delay Circuit 611 delays the assertion of reset signal 628 for some predetermined amount of time. This delay allows reset signal 628 to propagate to the coupled circuits before Flop 605 resets, thereby de-asserting reset signal 628.

It is noted that other frequency divider circuits are known and any suitable circuit may be used in conjunction with the concepts disclosed herein. The embodiment of FIG. 6 is merely one example. Frequency Divider 600 has been simplified to focus on features relevant to this disclosure. In other embodiments, additional circuit blocks may be included. Circuit blocks may also be configured differently in some embodiments.

Figure 7:
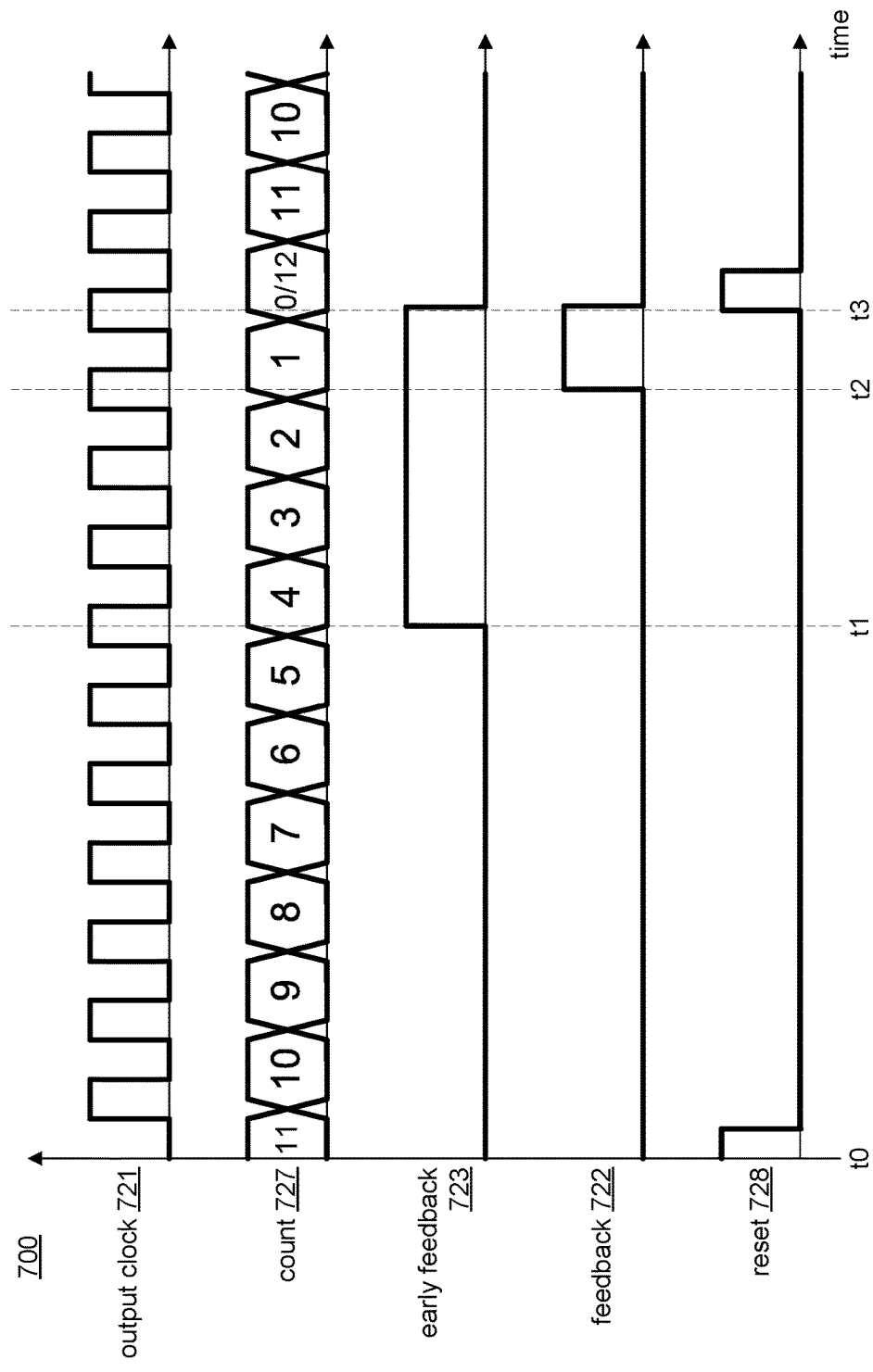
FIG. 7 shows a timing diagram illustrating possible waveforms of an embodiment of a frequency divider circuit.

Moving now to FIG. 7, a timing diagram illustrating possible waveforms of an embodiment of a frequency divider circuit is shown. The waveforms of timing diagram 700 illustrate logic levels versus time for various signals shown in FIG. 6. Referring collectively to FIG. 6 and FIG. 7, timing diagram 700 includes waveforms output clock 721, count value 727, early feedback clock 723, feedback clock 722, and reset signal 728. The waveforms in FIG. 7, in the illustrated embodiment, correspond to the similarly named and numbered signals in FIG. 6. It is noted that, in the illustrated example, the value of offset input 626 is set to four.

At time t0, in the illustrated embodiment, Frequency Divider 600 is completing a previous counting cycle. A previous assertion of reset signal 728 causes count value 727 to reset to divisor value 625. Between times t0 and t1, count value 727 decrements after each rising transition on output clock 721.

At time t1, count value 727 reaches the value of offset input 626, i.e., four. Match 604 asserts its output, resulting in Flop 609 asserting early feedback 723. Three periods of output clock 721 later, at time t2, count value 727 reaches the value of one. In response, Match 603 asserts its output, and Flop 607 asserts feedback clock 722 high.

One additional period of output clock 721 later, at time t3, and Match 602 asserts its output. In response, Flop 605 asserts reset signal 728, which, in turn, resets Flop 607 and Flop 609. Flop 605 is reset after a delay determined by Delay Circuit 611. As a result, feedback 722 and early feedback 723 are de-asserted. Count value 727 reloads divisor value 625, causing count value 727 to change during this clock period of output clock 721. A next counting cycle begins.

It is noted that the number of periods of output clock 721 is eleven between times t1 and t3. It is further noted that divisor value 625 changes from 11 to 12 at time t3. This change may be due to DSM 111 in FIG. 1 adjusting divisor value 625 to achieve a frequency of output clock that is, for example, between 11 and 12 times higher than ref clock 120.

It is also noted that timing diagram 700 of FIG. 7 merely illustrates an example of signals resulting from one embodiment of Frequency Divider 600. The signals are simplified to provide clear descriptions of the disclosed concepts. In various embodiments, the signals may appear different due various influences such as technology choices for building the circuits, actual circuit design and layout, ambient noise in the environment, choice of power supplies, etc.

Figure 8:
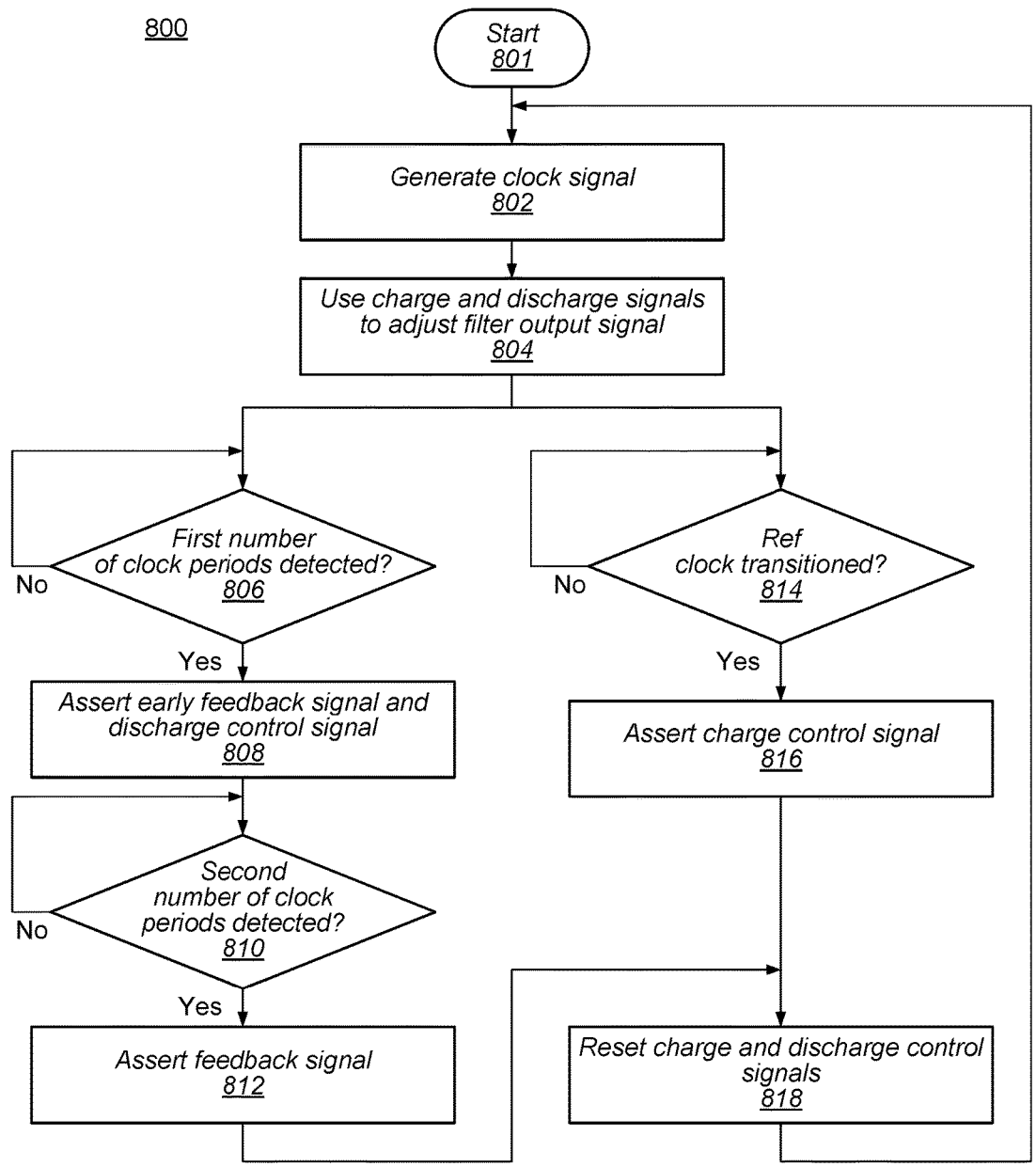
FIG. 8 illustrates a flow diagram of an embodiment of a method for operating a closed-loop clock generation circuit.

Moving to FIG. 8, a flow diagram is illustrated of an embodiment of a method for operating a closed-loop clock generation circuit, implementing the concepts disclosed above. The method may be applied to a clock generation circuit, such as, for example, Clock Generation Circuit 100 in FIG. 1, including a phase detection circuit such as, e.g., Phase Detection Circuit 400. Referring collectively to Clock Generation Circuit 100, Phase Detection Circuit 400 and Method 800 in FIG. 8, the method may begin in block 801.

The clock generation circuit generates a clock signal based on an output of a filter circuit (block 802). In the illustrated embodiment, Clock Generation Circuit 100 generates output clock 121 from VCO 107. LPF output 128 is received by VCO 107 from LPF 105. A voltage level of LPF output 128 may determine or influence a frequency of output clock 121.

The output of the filter circuit is adjusted based on a charge signal and a discharge signal (block 804). The voltage level of LPF output 128 is based on an output of Charge Pump 103. The output of Charge Pump 103 is adjusted based on the signals Charge 124 and Discharge 125. When Charge 124 is asserted, Charge Pump 103 sources current into LFP 105, thereby increasing the voltage level of LPF output 128. Conversely, when Discharge 125 is asserted, Charge Pump 103 sinks current from LPF 105, thereby decreasing the voltage level of LPF output 128. If both Charge 124 and Discharge 125 are asserted in parallel, then the current from CP output 127 into LPF 105 may be close to zero, and LPF output 128 may remain relatively unchanged.

Further operations of Method 800 may depend on a number of periods of the clock signal that have been detected (block 806). Frequency Divider 109 counts a number of periods of output clock 121 that have occurred since a reset signal. It is noted that while in the illustrated example, Frequency Divider 109 decrements a count value, in other embodiments, Frequency Divider 109 may increment the count value. The reset signal is asserted upon the count value reaching zero. Before reaching zero, Frequency Divider 109 is set to determine when a first number of periods of output clock 121 have occurred. If the first number of periods have occurred, then the method moves to block 808 to assert an early feedback signal. Otherwise, the method remains in block 806.

An early feedback signal and a discharge control signal are asserted in response to determining that the first number of clock periods have occurred (block 808). Frequency Divider 109 asserts Early Feedback Clock 123 after the first number of periods of output clock 121 have occurred. Early Feedback Clock 123 is received by Phase Detect Circuit 101 and the assertion of Early Feedback Clock 123 causes Phase Detect Circuit 101 to assert Discharge 125.

Continuing operations of Method 800 may again depend on the number of periods of the clock signal that have been detected (block 810). Frequency Divider 109 continues to track the number of periods of output clock 121 after the first number is reached. Frequency Divider 109 is set to determine when a second number of periods of output clock 121 have occurred. In the illustrated embodiment, Frequency Divider 109 is set to determine when the count value reaches a value of one, although other values may be used in other embodiments. If the second number of periods have occurred, then the method moves to block 812 to assert a feedback signal. Otherwise, the method remains in block 810.

A feedback signal is asserted in response to determining that the second number of clock periods have occurred (block 812). Frequency Divider 109 asserts Feedback Clock 122 after the second number of periods of output clock 121 have occurred. Feedback Clock 122 is sent to Phase Detect Circuit 101. Phase Detect 101 may assert a control signal, such as, for example, Control 426 in FIG. 4, in response to the assertion of Feedback Clock 122.

In parallel with depending on a number of periods of the clock signal that have been detected, Method 800 may also depend on determining if a reference clock signal has transitioned (block 814). Phase Detect Circuit 101 receives ref clock 120 and determines if a rising transition has occurred. In other embodiments, Phase Detect Circuit 101 may determine if a falling transition occurs, rather than a rising transition. If a rising transition is detected, then the method moves to block 816 to generate the charge control signal. Otherwise, the method remains in block 814.

The charge control signal is asserted (block 816). Phase Detect Circuit 101 asserts Charge 124 in response to a rising transition on ref clock 120. Charge 124 is sent to Charge Pump 103 to adjust CP output 127.

The charge control and discharge control signals are reset (block 818). The method waits for both Charge 124 (corresponding to Charge 424 in FIG. 4) and Control 426 to be asserted. Once both then an output of AND gate 404 is asserted. The output of AND gate 404 is delayed for some amount of time by Delay Circuit 405. An output of Delay Circuit 405 corresponds to reset signal 427. When reset signal 427 is asserted, Flops 401-403 are reset. Both Charge 124 and Discharge 125 (also Discharge 425 in FIG. 4) are de-asserted when Flops 401-403 reset, as is control 426. The method returns to block 802 to being another counting cycle.

It is noted that the method illustrated in FIG. 8 is merely an example. In other embodiments, variations of this method are contemplated. Some operations may be performed in a different sequence, and/or additional operations may be included. In some embodiments, some operations may occur in parallel.

Figure 9:
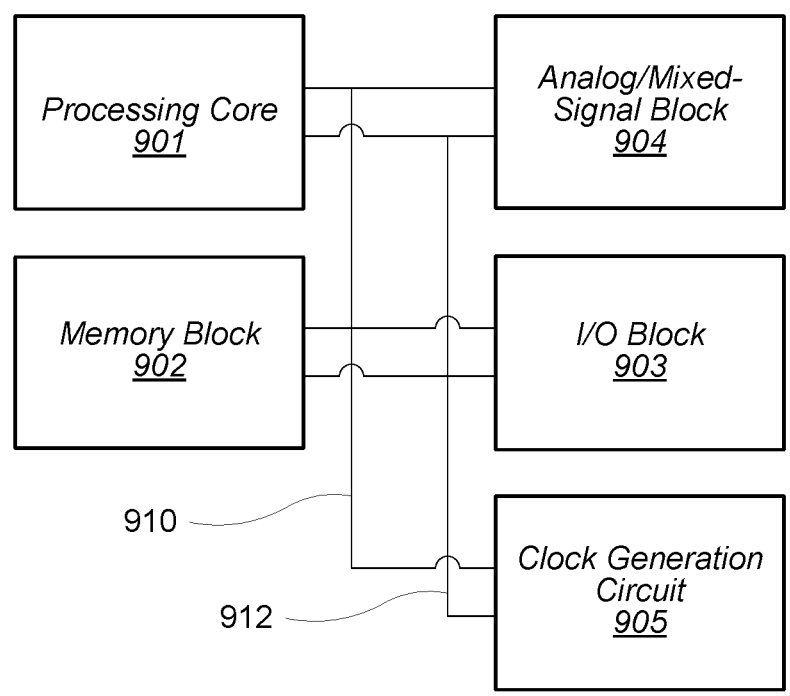
FIG. 9 illustrates an embodiment of an integrated circuit (IC) including various circuit blocks coupled to a clock generation circuit.

Turning now to FIG. 9, a block diagram of an embodiment of an integrated circuit (IC) is illustrated. IC 900 may include a clock generation circuit, such as, for example, Clock Generation Circuit 100 in FIG. 1. In the illustrated embodiment, IC 900 includes Processing Core 901 coupled to Memory Block 902, I/O Block 903, Analog/Mixed-Signal Block 904, Clock Generation Circuit 905, all coupled through bus 190. Additionally, Clock Generation Circuit 905 provides a clock signal 912 to the circuit blocks in IC 900. In various embodiments, IC 900 may correspond to a system on a chip (SoC) for use in a mobile computing application such as, e.g., a tablet computer, smartphone or wearable device.

Processing Core 901 may, in various embodiments, be representative of a general-purpose processor that performs computational operations. For example, Processing Core 901 may be a central processing unit (CPU) such as a microprocessor, a microcontroller, an application-specific integrated circuit (ASIC), or a field-programmable gate array (FPGA). In some embodiments, Processing Core 901 may include multiple CPU cores and may include one or more register files and memories. In various embodiments, Processing Core 901 may implement any suitable instruction set architecture (ISA), such as, e.g., PowerPC™, or x86 ISAs, or combination thereof. Processing Core 901 may include one or more bus transceiver units that allow Processing Core 901 to communication to other functional circuits via bus 190, such as, Memory Block 902, for example.

Memory Block 902 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM), for example. Some embodiments may include a single memory, such as Memory Block 902 and other embodiments may include more than two memory blocks (not shown). In some embodiments, Memory Block 902 may be configured to store program instructions that may be executed by Processing Core 901. Memory Block 902 may be configured to store data to be processed, such as graphics data, for example. Memory Block 902, may, in some embodiments, include a memory controller for interfacing to memory external to IC 900, such as, for example, one or more DRAM chips.

I/O Block 903 is, in one embodiment, configured to coordinate data transfer between IC 900 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. I/O Block 903 may include general-purpose input/output pins (I/O pins). In some embodiments, I/O Block 903 may be configured to implement a version of Universal Serial Bus (USB) protocol, IEEE 1394 (Firewire®) protocol, or an Ethernet (IEEE 802.3) networking standard.

In the illustrated embodiment, Analog/Mixed-Signal Block 904 includes one or more analog circuits. For example Analog/Mixed-Signal Block 904 may include a crystal oscillator, an internal oscillator, a phase-locked loop (PLL), delay-locked loop (DLL), or frequency-locked loop (FLL). One or more analog-to-digital converters (ADCs) or digital-to-analog converters (DACs) may also be included in analog/mixed signal block 904. In some embodiments, Analog/Mixed-Signal Block 904 may include radio frequency (RF) circuits that may be configured for operation with cellular telephone networks, or other suitable RF-based networks. Analog/Mixed-Signal Block 904 may include one or more voltage regulators to supply one or more voltages to various functional circuits and circuits within those blocks.

Clock Generation Circuit 905 may be configured to initialize and manage outputs of one or more clock sources. In various embodiments, the clock sources may be located in Analog/Mixed-Signal Block 904, in Clock Generation Circuit 905, in other blocks within IC 900, or may come from a source external to IC 900, coupled through one or more I/O pins. In some embodiments, Clock Generation Circuit 905 may configure a selected clock source before it is distributed throughout IC 900. Clock Generation Circuit 905 may include one or more clock sources. In some embodiments, Clock Generation Circuit 905 may include one or more of PLLs, FLLs, DLLs, internal oscillators, oscillator circuits for external crystals, etc. One or more clock output signals 912 may provide clock signals to various circuits of IC 900.

Clock Generation Circuit 905 may, in some embodiments, correspond to Clock Generation Circuit 100 in FIG. 1, or Clock Generation Circuit 100 may be included in Clock Generation Circuit 905 as one of multiple clocking circuits. Clock output signals 912 may include output clock 121.

It is noted that the IC illustrated in FIG. 9 is merely an example. In other embodiments, a different number of circuit blocks and different configurations of circuit blocks may be possible, and may depend upon a specific application for which the IC is intended.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure. The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a frequency divider circuit configured to:
      generate an early feedback signal using a received clock signal; and
      assert a feedback signal after a particular delay from an assertion of the early feedback signal;
   a phase circuit configured to:
      generate a charge signal using a reference clock signal and the feedback signal; and
      generate a discharge signal using the early feedback signal, the reference clock signal, and the feedback signal; and
   a charge pump circuit configured to selectively charge or discharge a circuit node using the charge signal and the discharge signal.

2. The apparatus of claim 1, wherein the phase circuit is further configured to assert a control signal based on an assertion of the feedback signal.

3. The apparatus of claim 2, wherein the phase circuit is further configured to de-assert the charge signal and the discharge signal based on the control signal and the charge signal.

4. The apparatus of claim 3, wherein the phase circuit is further configured to de-assert the charge signal and the discharge signal after a delay of a particular amount of time from a determination that the charge signal and the control signal are asserted.

5. The apparatus of claim 1, wherein the phase circuit is further configured to assert the charge signal in response to an assertion of the reference clock signal.

6. The apparatus of claim 1, wherein the phase circuit is further configured to assert the discharge signal in response to an assertion of the early feedback signal.

7. The apparatus of claim 1, wherein the charge signal and the discharge signal are different signals.

8. A method for operating a clock generation circuit, comprising:
   generating, by a frequency divider circuit, an early feedback signal using a received clock signal;
   after a particular delay from an assertion of the early feedback signal, asserting, by the frequency divider circuit, a feedback signal;
   generating, by a phase circuit, a charge signal using a reference clock signal and the feedback signal;
   generating, by the phase circuit, a discharge signal using the early feedback signal, the reference clock signal, and the feedback signal; and
   modifying, by a charge pump circuit, an amount of charge on an output node based on the charge signal and the discharge signal.

9. The method of claim 8, further comprising asserting a control signal based on an assertion of the feedback signal.

10. The method of claim 9, further comprising de-asserting the charge signal and the discharge signal based on the control signal and the charge signal.

11. The method of claim 10, further comprising de-asserting the charge signal and the discharge signal after a delay of a particular amount of time from determining that the charge signal and the control signal are asserted.

12. The method of claim 8, further comprising asserting the charge signal in response to an assertion of the reference clock signal.

13. The method of claim 8, further comprising asserting the discharge signal in response to an assertion of the early feedback signal.

14. The method of claim 8, further comprising delaying the assertion of the feedback signal from the assertion of the early feedback signal by a number of periods of the received clock signal.

15. An apparatus, comprising:
   a first flop circuit configured to generate a charge signal using a reference clock signal;
   a second flop circuit configured to generate a discharge signal using an early feedback signal; and
   a third flop circuit configured to generate a control signal using a feedback signal, wherein the feedback signal is a delayed version of the early feedback signal; and
   a charge pump configured to modify an amount of charge on an output node based on the charge signal and the discharge signal.

16. The apparatus of claim 15, further comprising logic gate circuits configured to generate a reset signal using the charge signal and the control signal.

17. The apparatus of claim 16, wherein the logic gate circuits are further configured to delay an assertion of the reset signal from a point in time when the charge signal and the control signal are asserted.

18. The apparatus of claim 16, wherein the first flop circuit is further configured to de-assert the charge signal in response to an assertion of the reset signal.

19. The apparatus of claim 16, wherein the second flop circuit is further configured to de-assert the discharge signal in response to an assertion of the reset signal.

20. The apparatus of claim 15, wherein to generate the discharge signal, the second flop circuit is further configured to assert the discharge signal in response to an assertion of the early feedback signal.

* * * * *